US009722535B2

(12) United States Patent
Zhu et al.

(10) Patent No.: US 9,722,535 B2
(45) Date of Patent: Aug. 1, 2017

(54) METHOD AND DEVICE FOR ARC FAULT DETECTION FOR PHOTOVOLTAIC INVERTER AND PHOTOVOLTAIC INVERTER USING THE SAME

(71) Applicant: DELTA ELECTRONICS (SHANGHAI) CO., LTD, Shanghai (CN)

(72) Inventors: Xuancai Zhu, Shanghai (CN); Feidong Xu, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 85 days.

(21) Appl. No.: 14/983,704

(22) Filed: Dec. 30, 2015

(65) Prior Publication Data
US 2016/0282398 A1    Sep. 29, 2016

(30) Foreign Application Priority Data
Mar. 25, 2015 (CN) .......................... 2015 1 0133577

(51) Int. Cl.
*G01R 31/02* (2006.01)
*H02S 50/10* (2014.01)
*H02S 50/00* (2014.01)
*G01R 31/12* (2006.01)
*G01R 31/42* (2006.01)

(52) U.S. Cl.
CPC .......... *H02S 50/10* (2014.12); *G01R 31/1227* (2013.01); *H02S 50/00* (2013.01); *G01R 31/42* (2013.01)

(58) Field of Classification Search
CPC ...... G01R 31/025; G01R 31/42; G01R 31/12; G01R 31/40; G01R 31/1227; H02S 50/00; H02S 50/10; H02S 40/32; H02S 40/34; H02S 40/44; H02S 40/36; H02J 3/38; H02J 3/383
See application file for complete search history.

(56) References Cited

U.S. PATENT DOCUMENTS

2014/0347069 A1* 11/2014 Krumpholz .......... G01R 31/025
                                                              324/541

* cited by examiner

*Primary Examiner* — Minh N Tang
(74) *Attorney, Agent, or Firm* — Yunling Ren

(57) ABSTRACT

The present disclosure provides a method and a device for arc fault detection for a photovoltaic inverter, and a photovoltaic inverter using the same. The method includes: acquiring current signals at a DC side of the photovoltaic inverter; obtaining frequency spectral characteristics of the current signal according to the current signal; judging whether the frequency spectral characteristics of the current signal have a frequency spectral characteristic of an arc; and if the frequency spectral characteristics of the current signal have a frequency spectral characteristic of an arc, shutting down the photovoltaic inverter, acquiring respectively a first input voltage when the photovoltaic inverter is shut down and a second input voltage after a predetermined time period after the shutdown, calculating a voltage drop from the first input voltage to the second input voltage, and judging whether an arc fault occurs according to the voltage drop.

15 Claims, 4 Drawing Sheets

METHOD AND DEVICE FOR ARC FAULT DETECTION FOR PHOTOVOLTAIC INVERTER AND PHOTOVOLTAIC INVERTER USING THE SAME

CROSS REFERENCE TO RELATED APPLICATION

This application is based upon and claims the benefit of priority from the prior Chinese Patent Application No.201510133577.4 filed on Mar. 25, 2015, entitled "METHOD AND DEVICE FOR ARC FAULT DETECTION FOR PHOTOVOLTAIC INVERTER AND PHOTOVOLTAIC INVERTER USING THE SAME", before Chinese State Intellectual Property Office, under 35 U.S.C. §119. The content of the above prior Chinese Patent Application is incorporated herein by reference in its entirety.

TECHNICAL FIELD

The present disclosure generally relates to the field of photovoltaic power generation, and more particularly, to a method and a device for arc fault detection for a photovoltaic inverter and the photovoltaic inverter using the method and the device.

BACKGROUND

In photovoltaic power generation, DC (Direct Current) arc may occur due to humidity, wire insulation corruption, wire ends loose, etc. The DC arc may produce high temperature and flame, even lead to a fire disaster. Accordingly, a photovoltaic inverter needs an arc fault detection device or a function of arc fault detection, and then informs the interrupt circuit to interrupt the DC arc.

A conventional method for arc fault detection is to detect the noise signal upon DC current at a DC side of the inverter, so as to judge whether an arc fault occurs according to a frequency domain characteristic of the DC current. However, since the inverter is a switching power device, switching actions may produce high frequency interference signals, which may lead to a misjudgment through the method for judging whether an arc fault occurs only according to the frequency domain characteristic. Further, once it is misjudged that an arc fault occurs, a protective device of the inverter may shut down the inverter, which may lead to an economic loss of the user or owner. Accordingly, it is necessary to find a method for accurately identifying an arc fault.

SUMMARY

In view of the above, the present disclosure intends to provide a method and a device for arc fault detection for a photovoltaic inverter and a photovoltaic inverter using the same, which may identify a misjudgment from the judgment of an arc fault based on a frequency domain characteristic, such that false triggering of the corresponding protective device may be effectively reduced.

Other aspects and advantages of the present disclosure will partly be described in the following description, partly become apparent from the description, and partly be learnt from practice the present disclosure.

An aspect of the present disclosure provides a method for arc fault detection for a photovoltaic inverter, including: acquiring current signals at a DC side of the photovoltaic inverter; obtaining frequency spectral characteristics of the current signal according to the current signal; judging whether the frequency spectral characteristics of the current signal have a frequency spectral characteristic of an arc; and if the frequency spectral characteristics of the current signal have a frequency spectral characteristic of an arc, then shutting down the photovoltaic inverter; acquiring respectively a first input voltage when the photovoltaic inverter is shut down and a second input voltage after a predetermined time period after the shutdown; calculating a voltage drop from the first input voltage to the second input voltage, and judging whether an arc fault occurs according to the voltage drop.

In an embodiment, the above method for arc fault detection for a photovoltaic inverter further includes: if no arc fault is detected, then re-starting the photovoltaic inverter normally, and if an arc fault is detected, then sending information about the arc fault.

In another embodiment, obtaining the frequency spectral characteristics of the current signal according to the current signal includes: converting the current signal into a digital signal, and performing a Fast Fourier Transform on the digital signal, to obtain the frequency spectral characteristics of the current signal.

In still another embodiment, judging whether the frequency spectral characteristics of the current signal have a frequency spectral characteristic of an arc includes: selecting frequency spectral characteristics of a specific frequency band from the frequency spectral characteristics of the current signal, judging whether the frequency spectral characteristics of the specific frequency band exceed a predetermined power threshold, compared with a basic frequency spectral characteristic of the current signal, and if it exceeds the power threshold, judging that the frequency spectral characteristics of the current signal have a frequency spectral characteristic of an arc.

In still another embodiment, the specific frequency band excludes switching frequencies of the photovoltaic inverter and frequencies which are multiplication of the switching frequencies.

In still another embodiment, judging whether an arc fault occurs according to the voltage drop includes: if the voltage drop exceeds a voltage threshold, judging that an arc fault occurs.

Another aspect of the present disclosure provides a device for arc fault detection for a photovoltaic inverter, including: a current-signal acquiring unit, configured to acquire current signals at a DC side of the photovoltaic inverter; an input-voltage acquiring unit, configured to acquire an input voltage of the photovoltaic inverter; and a processing unit, coupled respectively to the current-signal acquiring unit and the input-voltage acquiring unit, configured to obtain frequency spectral characteristics of the current signal according to the current signal acquired by the current-signal acquiring unit, judge whether the frequency spectral characteristics of the current signal have a frequency spectral characteristic of an arc, and if the frequency spectral characteristics of the current signal have a frequency spectral characteristic of an arc, shut down the photovoltaic inverter, calculate a voltage drop from a first input voltage when the photovoltaic inverter is shut down to a second input voltage after a predetermined time period after the shutdown acquired by the input-voltage acquiring unit, and judge whether an arc fault occurs according to the voltage drop.

In an embodiment, if no arc fault is detected, the processing unit is further configured to normally start the photovoltaic inverter, and if an arc fault is detected, the processing unit is further configured to send information about the arc fault.

In another embodiment, to obtain frequency spectral characteristics of the current signal according to the current signal includes: convert the current signal into a digital signal, and perform a Fast Fourier Transform on the digital signal, to obtain the frequency spectral characteristics of the current signal.

In still another embodiment, to judge whether the frequency spectral characteristics of the current signal have a frequency spectral characteristic of an arc includes: select frequency spectral characteristics of a specific frequency band from the frequency spectral characteristics of the current signal, judge whether the frequency spectral characteristics of the specific frequency band exceed a predetermined power threshold, compared with a basic frequency spectral characteristic of the current signal, and if it exceeds the power threshold, judge that the frequency spectral characteristics of the current signal have a frequency spectral characteristic of an arc.

In still another embodiment, the specific frequency band excludes switching frequencies of the photovoltaic inverter and frequencies multiplication of the switching frequencies.

In still another embodiment, to judge whether an arc fault occurs according to the voltage drop includes: if the voltage drop exceeds a voltage threshold, judge that an arc fault occurs.

Another aspect of the present disclosure provides a photovoltaic inverter, including: any of the above device for arc fault detection; a current detection circuit, coupled to the device for arc fault detection, configured to detect current signals at a DC side of the photovoltaic inverter, and output the current signal to the device for arc fault detection; and a voltage detection circuit, coupled to the device for arc fault detection, configured to detect an input voltage at the DC side of the photovoltaic inverter, and output the input voltage to the device for arc fault detection.

In an embodiment, the current detection circuit includes: a current transformer and a band-pass filter; or a current sampling resistor and a band-pass filter; and/or the voltage detection circuit, includes: a differential amplifier circuit.

In another embodiment, the device for arc fault detection is a microcontroller.

BRIEF DESCRIPTION OF THE DRAWINGS

The above and other features and advantages of the present disclosure will become more apparent from the detailed description of the exemplary embodiments with reference to accompanying drawings.

DETAILED DESCRIPTION

Hereinafter, the exemplary embodiments are fully described with reference to the accompany drawings. However, the exemplary embodiments may be implemented in various forms, and should not be construed as being limited to the embodiments set forth herein. Rather, these embodiments are provided to make the present disclosure more complete and thorough, and to fully convey the concept of the exemplary embodiments to those skilled in the art. In the accompany drawings, same reference numbers refer to same or similar structure throughout the accompany drawings, detailed description of which may be omitted.

In addition, the described features, structures and characteristics may be combined to one or more embodiments in any proper manner. In the following description, many specific details are provided for sake of thorough understanding of the embodiments of the present disclosure. However, it will be appreciated by those skilled in the art that, the technical solutions of the present disclosure may be practiced without one or more of the particular details, or may adopt other methods, configurations and elements, etc. Known structures, methods or operations will not be illustrated in detail so as to avoid obscuring the aspects of the present disclosure.

Figure 1:
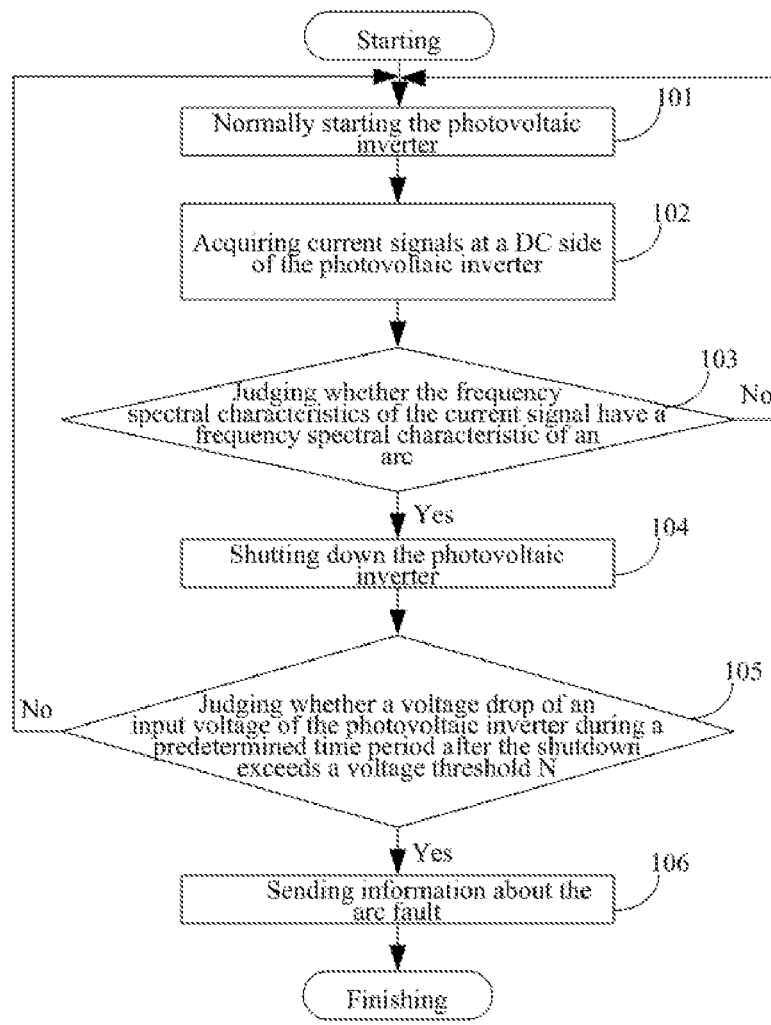
FIG. 1 is a flowchart of a method for arc fault detection for a photovoltaic inverter according to an exemplary embodiment.

FIG. 1 is a flowchart of a method for arc fault detection for a photovoltaic inverter according to an exemplary embodiment. As shown in FIG. 1, the method for arc fault detection for a photovoltaic inverter includes the following steps.

In step S101, the photovoltaic inverter is normally started.

For example, the normally starting of the photovoltaic inverter may be instructed by means of setting a flag bit of arc fault detection mistake. If the flag bit of arc fault detection mistake is set; the photovoltaic inverter is instructed to be shut down. If the flag bit is cleared, the photovoltaic inverter is instructed to be normally started.

In step S102, a current signal at a DC side of the photovoltaic inverter is acquired.

If the acquired current signal is an analog signal, the analog current signal needs to be converted to a digital signal. If the acquired current signal is already a digital signal, the AID (analog/digital) conversion may be not necessary.

In step S103, it is judged whether frequency spectral characteristics of the current signal have a frequency spectral characteristic of an arc. If they have no frequency spectral characteristic of an arc, the process is returned to step S102. Otherwise, step S104 is performed.

For example, a Fast Fourier Transform (FFT) is performed on the digital signal, to obtain the frequency spectral characteristics of the current signal, and then it is judged whether the frequency spectral characteristics of the current signal have a frequency spectral characteristic of an arc.

Figure 4:
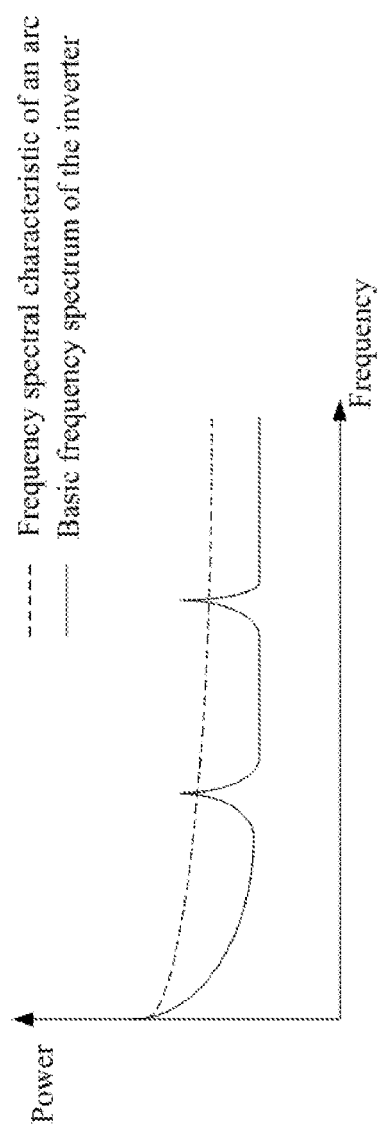
FIG. 4 is a schematic diagram of a frequency spectral curve of a current signal at a DC side of a photovoltaic inverter.

FIG. 4 is a schematic diagram of a frequency spectral curve of a current signal at a DC side of a photovoltaic inverter. As shown in FIG. 4, a solid line is a basic frequency spectrum of the inverter, i.e., a frequency spectral characteristic when no arc fault occurs. When an arc fault occurs, arc noises may be superposed on the basic frequency spectrum of the inverter, thereby to form a frequency spectral characteristic of the arc, shown by a dotted line in FIG. 4.

In some embodiments of the present disclosure, whether the frequency spectral characteristics of the current signal have a frequency spectral characteristic of an arc is judged by using a predetermined power threshold T. If the frequency spectral characteristics of the current signal exceed the predetermined power threshold T, it is judged that the frequency spectral characteristics of the current signal have a frequency spectral characteristic of an arc, thereby it is looked as that an arc fault occurs. Otherwise, it is judged that the frequency spectral characteristics of the current signal have no frequency spectral characteristic of an arc, thereby it is looked as that no arc fault occurs. The power threshold T may be set according to practice requirements.

In other embodiments of the present disclosure, in order to further reduce the interference of switching signals to the judgment of an arc, frequency spectral characteristics of a specific frequency band may be selected firstly, and then it is judged whether the frequency spectral characteristics of the specific frequency band have a frequency spectral characteristic of an arc. That is, the frequency spectral characteristics of the specific frequency band are compared with the power threshold T. If the frequency spectral characteristics of the specific frequency band exceed the power threshold T, it is judged that the frequency spectral characteristics of the specific frequency band have a frequency spectral characteristic of an arc, thereby it is looked as that an arc fault occurs. Otherwise, it is judged that the frequency spectral characteristics of the specific frequency band have no frequency spectral characteristic of an arc, thereby no arc fault occurs. It may be seen from the solid line in FIG. 4 that, due to the presence of the interference of switching signals of the photovoltaic inverter (high frequency interference), some spikes exist on the basic frequency spectrum curve, which may increase the power of signals at or near the frequencies of the spikes. Accordingly, the specific frequency band may be selected as excluding the switching frequencies and frequencies which are multiplication of the switching frequencies. That is, the selected specific frequency band may not include the switching frequencies and the frequencies which are multiplication of the switching frequencies, so as to reduce the interference produced by high frequency switches of the inverter to the arc fault detection.

In the above embodiments, in order to avoid the interference of the switching signals, the specific frequency band may be selected as excluding the switching frequencies and frequencies which are multiplication of the switching frequencies. However, in the present disclosure, the selection of the specific frequency band is not limited thereto. For example, when other interference sources exist, the specific frequency band may be selected as excluding the frequencies of these interference sources too, so as to reduce misjudgment of arc fault detection.

In step S104, the photovoltaic inverter is shut down.

For example, the photovoltaic inverter is shut down and stopped outputting power by means of setting the above flag bit of arc fault detection mistake.

In step S105, it is judged whether a voltage drop of an input voltage of the photovoltaic inverter exceeds a voltage threshold N during a predetermined time period after the shutdown. If it does not exceed the voltage threshold N, the process is returned to step S101, otherwise, step S106 is performed.

After the photovoltaic inverter is shut down, a first input voltage when the photovoltaic inverter is shut down and a second input voltage after the above predetermined time period are acquired respectively. The predetermined time period may be, for example, 1second, 5 seconds, etc. However, the present disclosure is not limited thereto.

After the above first input voltage and second input voltage are acquired, it is judged whether a voltage drop from the first input voltage to the second input voltage exceeds the voltage threshold N. If it does not exceed the voltage threshold N, the process is returned to step S101, otherwise, step S106 is performed.

In some embodiments, the above voltage threshold N may be a preset value obtained by test, which is between the input voltages when the inverter is shut down with real arc fault and without arc fault.

In step S106, information about the arc fault is sent out.

According to a voltage drop of the input voltage during a time period since the photovoltaic inverter is shut down, it is determined whether the judgment about the occurrence of an arc fault made according to the frequency spectral characteristic of an arc is a misjudgment. If it is not a misjudgment, that is, the voltage drop exceeds the voltage threshold, it is determined that an arc fault occurs, and information about the arc fault is sent out, so as to call maintenance personnel to repair the photovoltaic inverter.

It should be noted that, if the substantially same result may be obtained, the above steps may not necessarily be performed in accordance with the exact order shown in FIG. 1.

Figure 2:
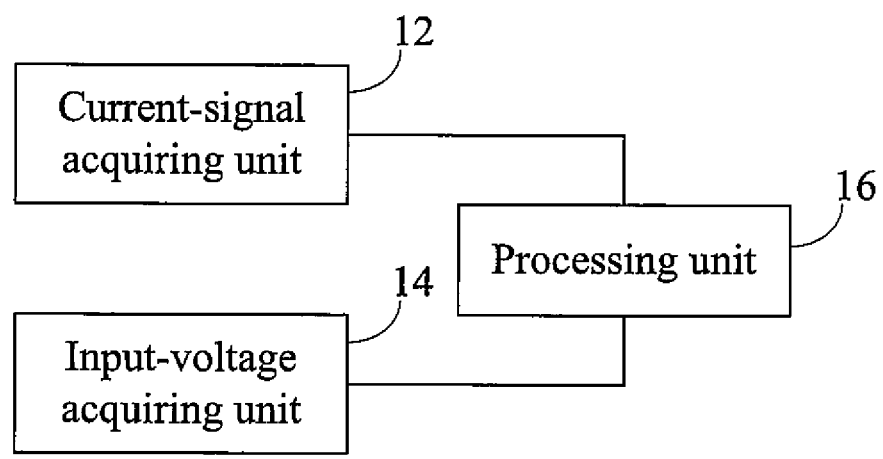
FIG. 2 is a structural diagram of a device for arc fault detection for a photovoltaic inverter according to an exemplary embodiment.

FIG. 2 is a structural diagram of a device for arc fault detection for a photovoltaic inverter according to an exemplary embodiment. As shown in FIG. 2, the device 1 for arc fault detection includes: a current-signal acquiring unit 12, an input-voltage acquiring unit 14 and a processing unit 16. Wherein the processing unit 16 is coupled to the current-signal acquiring unit 12 and the input-voltage acquiring unit 14 respectively.

The current-signal acquiring unit 12 is configured to acquire a current signal at a DC side of the photovoltaic inverter, and provide the acquired current signal to the processing unit 16.

The input-voltage acquiring unit 14 is configured to acquire an input voltage of the photovoltaic inverter, and provide the acquired input voltage to the processing unit 16.

The processing unit 16 is configured to perform operations of arc fault detection according to the received current signal and the input voltage.

If the acquired current signal is analog, the processing unit 16 needs to convert the analog current signal to a digital signal, and if the acquired current signal is already a digital signal, the A/D conversion is not necessary.

The processing unit 16 obtains frequency spectral characteristics of the current signal according to the received current signal. For example, a Fast Fourier Transform (FFT) is performed on the digital signal, to obtain the frequency spectral characteristics of the current signal, and then it is judged whether the frequency spectral characteristics of the current signal have a frequency spectral characteristic of an arc.

In some embodiments, the processing unit 16 judges whether the frequency spectral characteristics of the current signal have a frequency spectral characteristic of an arc by means of using a predetermined power threshold T. If the frequency spectral characteristics of the current signal exceed the predetermined power threshold T, it is judged that the frequency spectral characteristics of the current signal have a frequency spectral characteristic of an arc, thereby it is looked as that an arc fault occurs. Otherwise, it is looked as that the frequency spectral characteristics of the current signal have no frequency spectral characteristic of an arc, thereby it is looked as that no arc fault occurs. The power threshold T may be set according to practice requirements.

In other embodiments of the present disclosure, in order to further reduce the interference of switching signals to the judgment of an arc fault, the processing unit 16 may select frequency spectral characteristics of a specific frequency band firstly, and then judges whether the frequency spectral characteristics of the specific frequency band have a frequency spectral characteristic of an arc. That is, the processing unit 16 may compare the frequency spectral characteristics of the specific frequency band with the power threshold T. If the frequency spectral characteristics of the specific frequency band exceed the power threshold T, the processing unit 16 judges that the frequency spectral characteristics of the specific frequency band have a frequency spectral characteristic of an arc, thereby determines that an arc fault occurs. Otherwise, the processing unit 16 judges that the frequency spectral characteristics of the specific frequency band have no frequency spectral characteristic of an arc, thereby determines that no arc fault occurs. It may be seen from the solid line in FIG. 4 that, due to the presence of the interference of switching signals of the photovoltaic inverter (high frequency interference), some spikes exist on the basic frequency spectrum curve, which may increase power signals at or near the frequencies of the spikes. Accordingly, the specific frequency band may be selected as excluding the switching frequencies and frequencies multiplication of the switching frequencies. That is, the selected specific frequency band may not include the switching frequencies and the frequencies multiplication of the switching frequencies, so as to reduce the interference produced by high frequency switches of the inverter to the arc fault detection.

In the above embodiments, in order to avoid the interference of the switching signals, the specific frequency band may be selected as excluding the switching frequencies and frequencies multiplication of the switching frequencies. However, in the present disclosure, the selection of the specific frequency band is not limited thereto. For example, when other interference sources exist, the specific frequency band may be selected as excluding the frequencies of these interference sources too, so as to reduce misjudgment of arc fault detection.

If the processing unit 16 judges that the frequency spectral characteristics of the current signal have a frequency spectral characteristic of an arc, it makes the photovoltaic inverter shut down and stop outputting power. Afterwards, the processing unit 16 judges whether a voltage drop of an input voltage of the photovoltaic inverter exceeds a voltage threshold N during a predetermined time period after the shutdown.

After the photovoltaic inverter is shut down, the processing unit 16 respectively acquires a first input voltage when the photovoltaic inverter is shut down and a second input voltage after the above predetermined time period via the input-voltage acquiring unit 14. The predetermined time period may be, for example, 1 second, 5 seconds, etc. However, the present disclosure is not limited thereto.

After the above first input voltage and second input voltage are acquired, the processing unit 16 judges whether a voltage drop from the first input voltage to the second input voltage exceeds the voltage threshold N. If it does not exceed the voltage threshold N, the processing unit 16 makes the photovoltaic inverter start again. If it exceeds the voltage threshold N, the processing unit 16 sends information about the arc fault.

In some embodiments, the above voltage threshold N may be a preset value obtained by test, which is between the input voltages when the inverter is shut down with real arc fault and without arc fault.

It should be understood by those skilled in the art that, the above various exemplary functional modules and steps of the methods described with reference to the embodiments may be implemented as electronic hardware, computer software or combination of the both. In order to explain the interchangeability between hardware and software more clearly, a general description has been given to functions of various schematic modules and steps. Such functions may be implemented as software or hardware, depending on specific application and design limit to the entire system. Those skilled in the art may implement the functions in various manners according to respective each specific applications, therefore, these implementation should not be construed as departing from the scope of the present disclosure.

In the method and a device for arc fault detection for a photovoltaic inverter provided by the present disclosure, it is judged whether the frequency spectral characteristics of the current signal have a frequency domain characteristic of an arc, to judge whether an arc occurs. If an arc is detected, the photovoltaic inverter is shut down. Afterwards, it is further judged whether the above judgment about the occurrence of an arc is a misjudgment according to the voltage drop of the input voltage during a period since the photovoltaic inverter is shut down. If it is a misjudgment, the photovoltaic inverter is started to operate again. Otherwise, information about an arc fault is sent out, so as to inform maintenance personnel to confirm the fault. Through the synthetic judging mechanism of the present disclosure, misjudgment of arc fault and correspondingly false triggering of the protective device caused by interference of the inverter itself may be effectively reduced.

Figure 3:
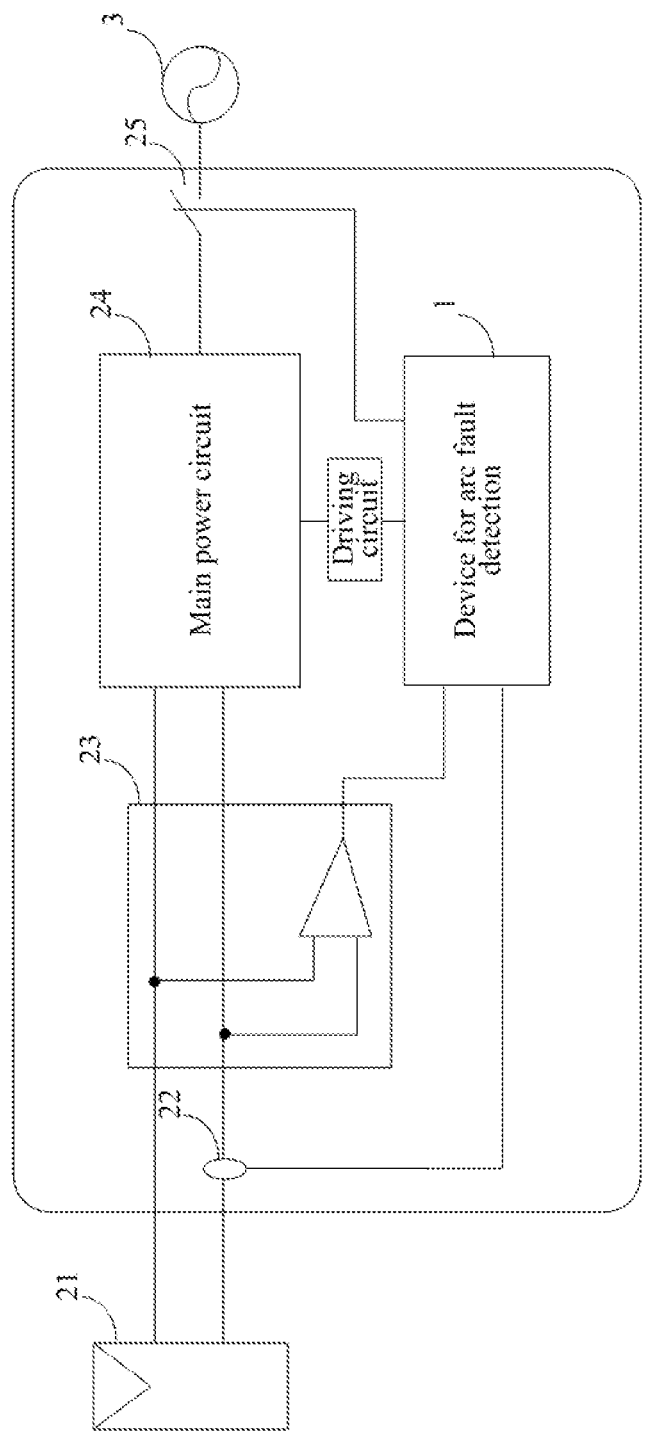
FIG. 3 is a structural diagram of a photovoltaic inverter according to an exemplary embodiment.

FIG. 3 is a structural diagram of a photovoltaic inverter according to an exemplary embodiment. As shown in FIG. 3, an input terminal of a photovoltaic inverter 2 is connected to a photovoltaic panel 21, for receiving a DC from the photovoltaic panel and outputting an AC to an electrical grid 3. The photovoltaic inverter 2 further includes: a current detection circuit 22, a voltage detection circuit 23 and the above device 1 for arc fault detection.

The current detection circuit 22 is coupled to the device 1 for arc fault detection, configured to detect a current signal at a DC side of the photovoltaic inverter 2, and output the current signal to the device 1 for arc fault detection. The current detection circuit 22 includes, for example, a current transformer and a band-pass filter, or a current sampling resistor and a band-pass filter.

The voltage detection circuit 23 is coupled to the device 1 for arc fault detection, configured to detect an input voltage at the DC side of the photovoltaic inverter 2, or the output voltage of the photovoltaic panel, and provide the input voltage to the device 1 for arc fault detection. The voltage detection circuit 23 includes, for example, a differential amplifier circuit.

The device 1 for arc fault detection acquires the above current signal and input voltage respectively from the current detection circuit 22 and the voltage detection circuit 23, to perform the operations of arc fault detection. The specific operations have been described in the above, and will not be repeated herein.

The device 1 for arc fault detection may be coupled to a main power circuit 24 and a control switch 25 for controlling an AC output in the photovoltaic inverter 2, to send the information about an arc fault thereto when it is judged that an arc fault occurs, such that the main power circuit 24 may be shut down and/or the control switch 25 may be disconnected, so as to cease power output. The main power circuit 24 is configured to perform DC-to-AC inverting operations of the inverter, which is well known by those skilled in the art and will not be elaborated herein.

In some embodiments, the device 1 for arc fault detection may be a microcontroller in the photovoltaic inverter 2. That is, the microcontroller may implement all the functions of the device 1 for arc fault detection.

In the photovoltaic inverter provided by the present disclosure, it is judged whether the frequency spectral characteristics of the current signal have a frequency domain characteristic of an arc, to judge whether an arc occurs. If an arc is detected, the photovoltaic inverter is shut down. Afterwards, it is further judged whether the above judgment about the occurrence of an arc fault is a misjudgment according to the voltage drop of the input voltage during a period since the photovoltaic inverter is shut down. If it is a misjudgment, the photovoltaic inverter is started to operate again. Otherwise, information about an arc fault is sent out, so as to inform maintenance personnel to confirm the fault. Through the synthetic judging mechanism of the present disclosure, misjudgment of arc and correspondingly false triggering of the protective device caused by interference of the inverter itself may be effectively reduced.

The exemplary embodiments of the present disclosure have been illustrated and described in detail. It should be understood that the present disclosure is not limited to the disclosed embodiments. Instead, the present disclosure is intended to cover various alteration and equivalent replacement falling in the scope of the appended claims.

What is claimed is:

1. A method for arc fault detection for a photovoltaic inverter, comprising:
   acquiring current signals at a DC side of the photovoltaic inverter;
   obtaining frequency spectral characteristics of the current signal according to the current signal;
   judging whether the frequency spectral characteristics of the current signal have a frequency spectral characteristic of an arc; and
   if the frequency spectral characteristics of the current signal have a frequency spectral characteristic of an arc,
      shutting down the photovoltaic inverter,
      acquiring respectively a first input voltage when the photovoltaic inverter is shut down and a second input voltage after a predetermined time period after the shutdown,
      calculating a voltage drop from the first input voltage to the second input voltage, and
      judging whether an arc fault occurs according to the voltage drop.

2. The method for arc fault detection according to claim 1, further comprising:
   if no arc fault is detected, then re-starting the photovoltaic inverter normally, and
   if an arc fault is detected, then sending information about the arc fault.

3. The method for arc fault detection according to claim 1, wherein obtaining the frequency spectral characteristics of the current signal according to the current signal comprises:
   converting the current signal into a digital signal, and
   performing a Fast Fourier Transform on the digital signal, to obtain the frequency spectral characteristics of the current signal.

4. The method for arc fault detection according to claim 1, wherein judging whether the frequency spectral characteristics of the current signal have a frequency spectral characteristic of an arc comprises:
   selecting frequency spectral characteristics of a specific frequency band from the frequency spectral characteristics of the current signal,
   judging whether the frequency spectral characteristics of the specific frequency band exceed a predetermined power threshold, compared with a basic frequency spectral characteristic of the current signal, and
   if it exceeds the power threshold, judging that the frequency spectral characteristics of the current signal have a frequency spectral characteristic of an arc.

5. The method for arc fault detection according to claim 4, wherein the specific frequency band excludes switching frequencies of the photovoltaic inverter and frequencies which are multiplication of the switching frequencies.

6. The method for arc fault detection according to claim 1, wherein judging whether an arc fault occurs according to the voltage drop comprises:
   if the voltage drop exceeds a voltage threshold, judging that an arc fault occurs.

7. A device for arc fault detection for a photovoltaic inverter, comprising:
   a current-signal acquiring unit, configured to acquire current signals at a DC side of the photovoltaic inverter;
   an input-voltage acquiring unit, configured to acquire an input voltage of the photovoltaic inverter; and
   a processing unit, coupled respectively to the current-signal acquiring unit and the input-voltage acquiring unit, configured to obtain frequency spectral characteristics of the current signal according to the current signal acquired by the current-signal acquiring unit,
   judge whether the frequency spectral characteristics of the current signal have a frequency spectral characteristic of an arc, and if the frequency spectral characteristics of the current signal have a frequency spectral characteristic of an arc,
   shut down the photovoltaic inverter,
   calculate a voltage drop from a first input voltage when the photovoltaic inverter is shut down to a second input voltage after a predetermined time period after the shutdown acquired by the input-voltage acquiring unit, and
   judge whether an arc fault occurs according to the voltage drop.

8. The device for arc fault detection according to claim 7, wherein
   if no arc fault is detected, the processing unit is further configured to normally start the photovoltaic inverter, and
   if an arc fault is detected, the processing unit is further configured to send information about the arc fault.

9. The device for arc fault detection according to claim 7, wherein to obtain frequency spectral characteristics of the current signal according to the current signal comprises:
   convert the current signal into a digital signal, and
   perform a Fast Fourier Transform on the digital signal, to obtain the frequency spectral characteristics of the current signal.

10. The device for arc fault detection according to claim 7, wherein to judge whether the frequency spectral characteristics of the current signal have a frequency spectral characteristic of an arc comprises:
    select frequency spectral characteristics of a specific frequency band from the frequency spectral characteristics of the current signal,
    judge whether the frequency spectral characteristics of the specific frequency band exceed a predetermined power threshold, compared with a basic frequency spectral characteristic of the current signal, and if it exceeds the power threshold, judge that the frequency spectral characteristics of the current signal have a frequency spectral characteristic of an arc.

11. The device for arc fault detection according to claim 10, wherein the specific frequency band excludes switching frequencies of the photovoltaic inverter and frequencies which are multiplication of the switching frequencies.

12. The device for arc fault detection according to claim 7, wherein to judge whether an arc fault occurs according to the voltage drop comprises:
if the voltage drop exceeds a voltage threshold, judge that an arc fault occurs.

13. A photovoltaic inverter, comprising:
the device for arc fault detection according to claim 7;
a current detection circuit, coupled to the device for arc fault detection, configured to detect a current signal at a DC side of the photovoltaic inverter, and output the current signal to the device for arc fault detection; and
a voltage detection circuit, coupled to the device for arc fault detection, configured to detect an input voltage at the DC side of the photovoltaic inverter, and output the input voltage to the device for arc fault detection.

14. The photovoltaic inverter according to claim 13, wherein
the current detection circuit comprises: a current transformer and a band-pass filter, or a current sampling resistor and a band-pass filter, and/or
the voltage detection circuit comprises: a differential amplifier circuit.

15. The photovoltaic inverter according to claim 13, wherein the device for arc fault detection is a microcontroller.

* * * * *